(12) United States Patent
Sakurai et al.

(10) Patent No.: US 8,018,731 B2
(45) Date of Patent: Sep. 13, 2011

(54) INTERCONNECT SUBSTRATE AND ELECTRONIC CIRCUIT MOUNTED STRUCTURE

(75) Inventors: Daisuke Sakurai, Osaka (JP); Masato Mori, Osaka (JP); Yoshihiko Yagi, Hyogo (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 12/302,429

(22) PCT Filed: Jun. 19, 2007

(86) PCT No.: PCT/JP2007/062261
§ 371 (c)(1),
(2), (4) Date: Nov. 25, 2008

(87) PCT Pub. No.: WO2008/001641
PCT Pub. Date: Jan. 3, 2008

(65) Prior Publication Data
US 2009/0268423 A1 Oct. 29, 2009

(30) Foreign Application Priority Data

Jun. 27, 2006 (JP) ................................ 2006-176196

(51) Int. Cl.
*H05K 7/10* (2006.01)
*H05K 7/12* (2006.01)

(52) U.S. Cl. ........ 361/770; 361/790; 361/792; 361/791; 361/728

(58) Field of Classification Search .................. 361/770, 361/790–792, 728
See application file for complete search history.

(56) References Cited

U.S. PATENT DOCUMENTS

| 2002/0041155 A1* | 4/2002 | Asami et al. .................. 313/583 |
| 2005/0168961 A1* | 8/2005 | Ono et al. ..................... 361/784 |
| 2005/0184381 A1 | 8/2005 | Asahi et al. |

FOREIGN PATENT DOCUMENTS

| JP | 07-014946 | 1/1995 |
| JP | 2005-251889 | * 9/2005 |
| JP | 2005-333046 | 12/2005 |
| JP | 2006-040870 | 2/2006 |

* cited by examiner

Primary Examiner — Yuriy Semenenko
Assistant Examiner — Andargie M Aychillhum
(74) Attorney, Agent, or Firm — McDermott Will & Emery LLP

(57) ABSTRACT

Interconnect substrate (1) that connects at least the first circuit board and the second circuit board. Interconnect substrate (1) includes housing (1) and connecting terminal electrodes for connecting the top and bottom faces of housing (10). Housing (10) has protrusion (11) on its outer periphery and opening (13) in its inner periphery.

5 Claims, 10 Drawing Sheets

INTERCONNECT SUBSTRATE AND ELECTRONIC CIRCUIT MOUNTED STRUCTURE

RELATED APPLICATIONS

This application is the U.S. National Phase under 35 U.S.C. §371 of International Application No. PCT/JP2007/062261, filed on Jun. 19, 2007, which in turn claims the benefit of Japanese Application No. 2006-176196, filed on Jun. 27, 2006, the disclosures of which Applications are incorporated by reference herein.

TECHNICAL FIELD

The present invention relates to interconnect substrates for connecting a plurality of circuit boards, on which electronic components including IC chips are mounted; and electronic circuit mounted structures using the interconnect substrate.

BACKGROUND ART

In line with the continuing downsizing and high density of electronic devices, a structure using three-dimensionally stacked circuit boards, such as module boards, on which electronic components including IC chips and chip components are mounted, has been proposed. (For example, refer to Patent Document 1.) A proposed structure adopts a resin board as an interconnect substrate for connecting circuit boards, and two circuit boards are connected by soldering. This achieves a downsized, shorter, and thinner structure.

However, to cope with the advancement of functions of mobile devices such as mobile phones, the number of connecting terminals between circuit boards is increasing, and thus the terminal pitch of connecting terminals needs to be made finer. This results in reduced soldering area, which in turn causes reduced bonding strength. This leads to connection failures in mobile devices, which are often subject to impact, causing loss of reliability.

To prevent this, a method proposed is to bond and reinforce the circuit boards by applying adhesive resin around an outer side face of the interconnect substrate, after the circuit boards are connected by the interconnect substrate and thermally curing the adhesive resin. However, if the circuit boards re connected with the aforementioned conventional interconnect substrate, and adhesive resin is applied on their outer side face, the adhesive resin may splatter or a connection failure may occur between the circuit boards and interconnect substrate due to thermal expansion of the air in the space enclosed by the two circuit boards and interconnect substrate on heating the structure to cure the adhesive resin. In addition, since the air trapped inside the structure is repeatedly heated after being built into a mobile device, the inside air will repeatedly expand. This may ultimately result in a connection failure between the circuit boards and interconnect substrate, causing loss of reliability. If the viscosity of the adhesive resin is increased to enable application of the adhesive resin in spots so as to prevent air being trapped inside, the adhesive resin may not fully enter the space between the circuit boards, resulting in a smaller bonding area. Accordingly, sufficient adhesive force cannot be secured.

A package assembly structure for a resin-sealed semiconductor device that prevents separation of the bonded area between a case cover and outer case by thermal expansion of air in the sealed area is also proposed. (For example, refer to Patent Document 2.) In this method, sealing resin is applied to two sides of the case cover for bonding so as to prevent separation of the bonded area caused by the increase in pressure inside the case by expansion of air inside the package while curing the sealing resin, which might occur if the entire periphery of the case cover is bonded and sealed with the sealing resin. Using this bonding method, air expanded by heating is released from the remaining two sides to which the sealing resin is not applied. This prevents the increasing of inner pressure, and thus prevents separation of the bonded area.

In a conventional art disclosed in aforementioned Patent Document 1, splattering of adhesive resin or connection failure between the circuit boards and interconnect substrate may occur due to expansion of air inside the area surrounded by the top and bottom circuit boards and interconnect substrate, even if adhesive is applied to the outer side face of the interconnect substrate so as to improve the bonding strength between the circuit boards. In addition, after it is built into a mobile device, repetitive heating causes repeated thermal expansion of the air inside the circuit boards, risking eventual connection failure between circuit boards and interconnect substrate. This degrades the reliability.

In the case of a conventional art disclosed in aforementioned Patent Document 2, partial bonding of the case cover and the outer case in a resin-sealed semiconductor device prevents bonding failure between the case cover and outer case even if the air inside the sealed space is thermally expanded. Application of the adhesive resin may be easy in the case of semiconductor device disclosed. However, if the same method is applied to connection of two circuit boards using an interconnect substrate, the same disadvantage arises. This makes it difficult to reliably secure an area for releasing the air trapped inside the sealed space.

[Patent Document 1] Japanese Patent Unexamined Publication No. 2005-333046

[Patent Document 2] Japanese Patent Unexamined Publication No. H7-14946

SUMMARY OF THE INVENTION

An interconnect substrate connects at least the first circuit board and the second circuit board. The interconnect substrate has a frame-like polygonal shape, and includes housing and a plurality of connecting terminal electrodes for connecting the top and bottom faces of this housing. The housing has at least two protrusions on its outer side face.

An electronic circuit mounted structure includes the first circuit board, the second circuit board, the interconnect substrate for connecting the first circuit board and the second circuit board, and adhesive resin for bonding the first circuit board, the second circuit board, and the interconnect substrate. The interconnect substrate has a frame-like polygonal shape, and includes the housing and a plurality of connecting terminal electrodes for connecting the top and bottom faces of this housing. The housing has protrusions on its outer side face. Adhesive resin is not applied to at least one outer side face between the protrusions.

Figure 1A:
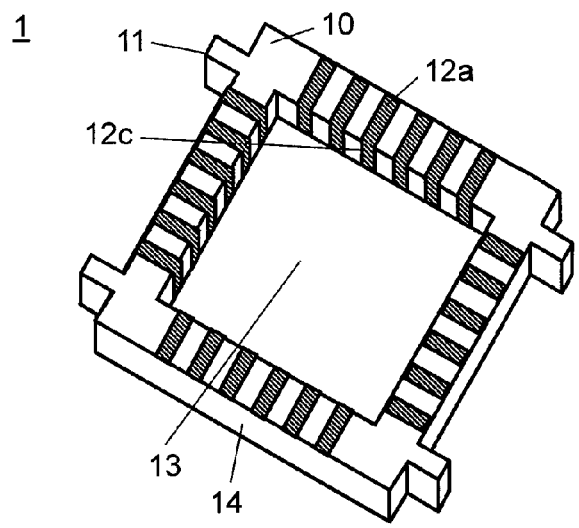
FIG. 1A is a schematic perspective view illustrating a structure of an interconnect substrate in accordance with a first exemplary embodiment of the present invention.

REFERENCE MARKS IN THE DRAWINGS 1, 2, 3, 4, 5, 6, 7, 8 Interconnect substrate
10, 20, 30, 40, 50 Housing
11, 21, 41, 51 Protrusion
12, 22, 32 Connecting terminal electrode
12a, 22a, 32a Top face terminal electrode
12b, 22b, 32b Bottom face terminal electrode
12c, 22c, 32c Connecting electrode
13, 23, 33 Opening
14, 24, 44, 54 Outer side face
15, 25 Shielding layer
34 Soldered portion
100, 200, 300 Electronic circuit mounted structure
101, 201, 301 First circuit board
102, 202, 302 Second circuit board
103, 203 Adhesive resin
104, 107, 204, 207, 304, 307 Circuit component
105, 106, 205, 206, 305, 306 Wiring pattern
108, 109 Side
110 Chip component
111 Shielding case

DETAILED DESCRIPTION OF PREFERRED EMBODIMENTS

Exemplary embodiments of the present invention are described below with reference to drawings.

First Exemplary Embodiment

Figure 1B:
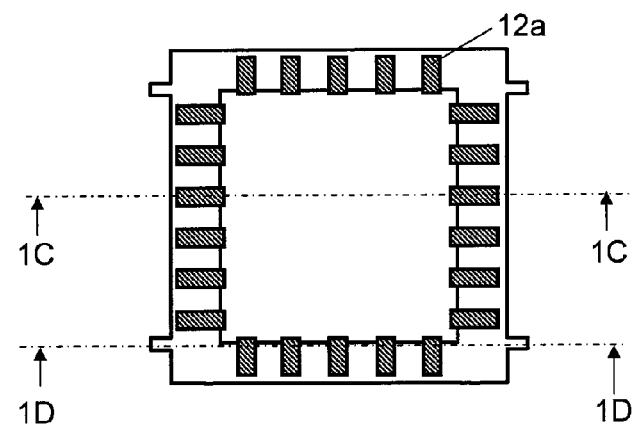
FIG. 1B is a schematic plan view illustrating the structure of the interconnect substrate in accordance with the first exemplary embodiment of the present invention.
Figure 1C:
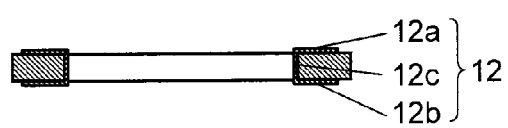
FIG. 1C is a sectional view taken along line IC-IC in FIG. 1B.
Figure 1D:
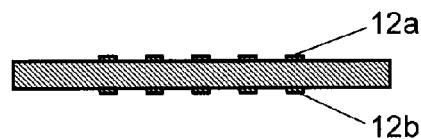
FIG. 1D is a sectional view taken along line 1D-1D in FIG. 1B.

FIGS. 1A to 1D illustrate an interconnect substrate in the first exemplary embodiment of the present invention. FIG. 1A is a schematic perspective view, FIG. 1B is a schematic plan view, FIG. 1C is a sectional view taken along line IC-IC in FIG. 1B, and FIG. 1D is a sectional view taken along line 1D-1D in FIG. 1B.

Interconnect substrate 1 in this exemplary embodiment has a frame-like polygonal shape, and includes housing 10 with protrusion 11 provided on its outer side face, and a plurality of connecting terminal electrodes 12 connecting top and bottom faces of housing 10. In this exemplary embodiment, two protrusions 11 are provided on each of two opposing outer side faces of housing 10. These protrusions 11 have the same thickness as that of housing 10, as shown in the drawings. Inside housing 10 is opening 13.

Housing 10 with protrusions 11 can be easily formed by processing resin, such as liquid crystal polymer, polyphenylene sulfide, or polyethylene terephthalate. Other than resin materials, ceramic material is also applicable. For example, a sintered body of alumina or aluminum nitride, or a sintered body of glass-added low-temperature-firing ceramic material may also be used. However, if high heat conductivity is needed, it is preferable to use a sintered body of ceramic materials such as alumina.

Connecting terminal electrodes 12 can be formed by etching a predetermined pattern after plating copper on the top face, inner side face, and bottom face of housing 10, typically by using both electroless plating and electrolytic plating. This achieves integral connection of top face terminal electrode 12a provided on the top face and bottom face terminal electrode 12b provided on the bottom face of housing 10 via connecting electrode 12c formed on the inner side face of housing 10. A thin gold film (not illustrated) is preferably formed on top face terminal electrode 12a, bottom face terminal electrode 12b, and connecting electrode 12c. In this case, for example, the thin gold film is preferably formed by gold plating after nickel plating on a copper-plated film. Solder precoating or anti-corrosive agent may also be applied to the copper-plated film. This improves the wettability of the solder, thus improving the reliability of the soldered portion.

How connecting terminal electrode 12 is formed is not limited to the above method. For example, connecting terminal electrode 12 may be formed by etching a predetermined pattern after attaching a copper foil to housing 10.

Figure 2:
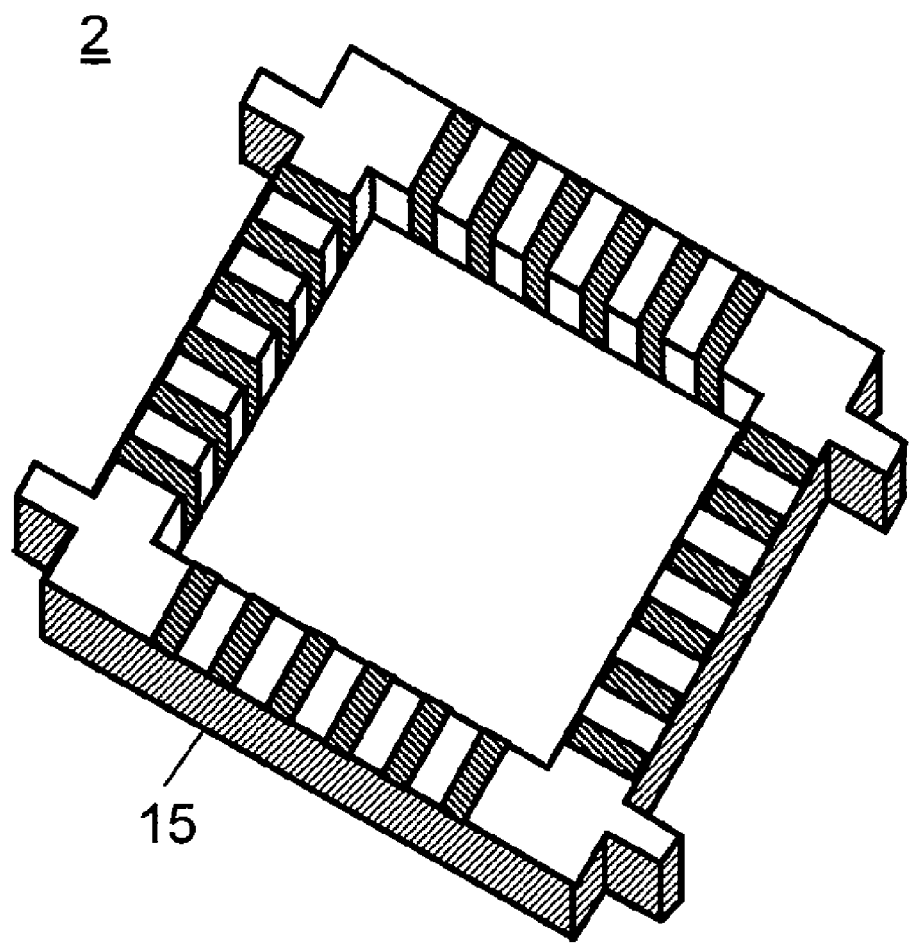
FIG. 2 is a schematic perspective view of another example of the interconnect substrate in accordance with the first exemplary embodiment of the present invention.

FIG. 2 is a schematic perspective view of another example, i.e., interconnect substrate 2, in this exemplary embodiment. As shown in FIG. 2, shielding layer 15 is provided on outer side face 14 of housing 10 of interconnect substrate 2. Shielding layer 15 is formed simultaneously with aforementioned connecting terminal electrode 12 through the same process. In this case, preferably, a part of shielding layer 15 is electrically connected to a ground terminal of connecting terminal electrode 12. Even more preferably, a ground terminal of connecting terminal electrode 12 is electrically connected to a ground plane of a plurality of circuit boards (not illustrated). This enables shielding of external noise to mounted circuit components inside the opening of the interconnect substrate on the circuit board, or emission of internal noise generated by circuit components from the interconnect substrate to outside.

Figure 3A:
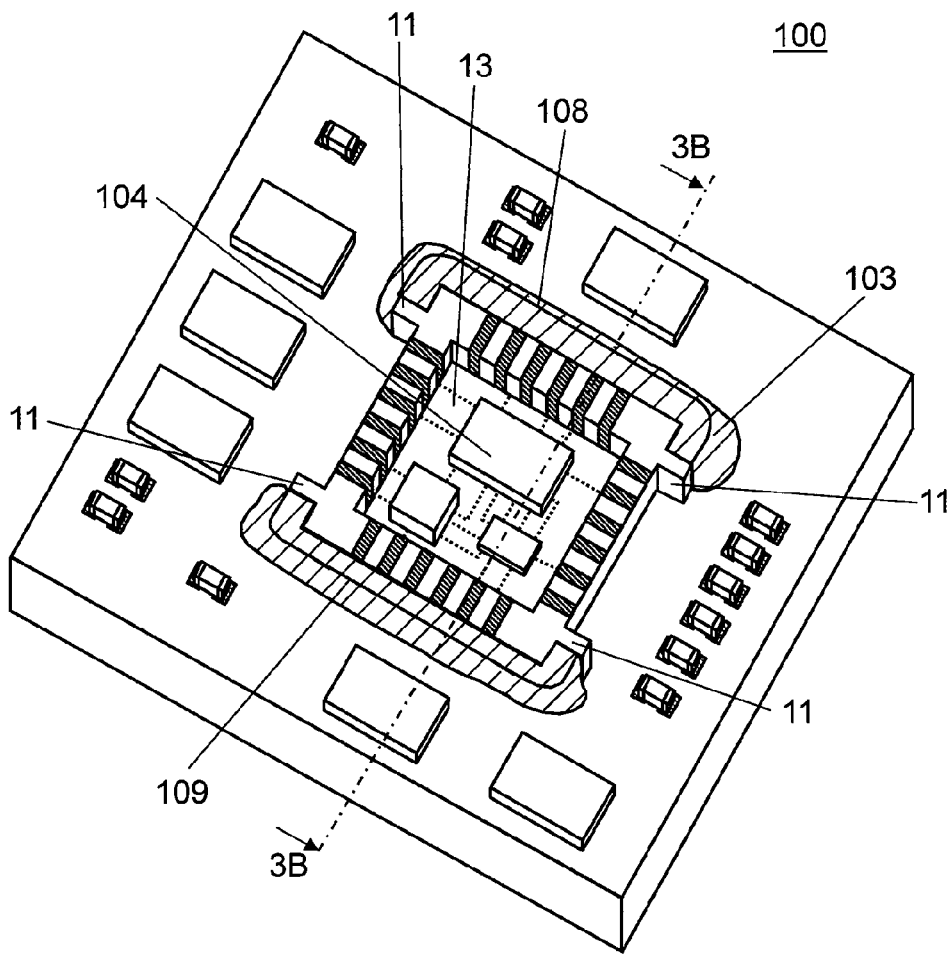
FIG. 3A is a schematic perspective view illustrating a structure of an electronic circuit mounted structure in accordance with the first exemplary embodiment of the present invention.
Figure 3B:
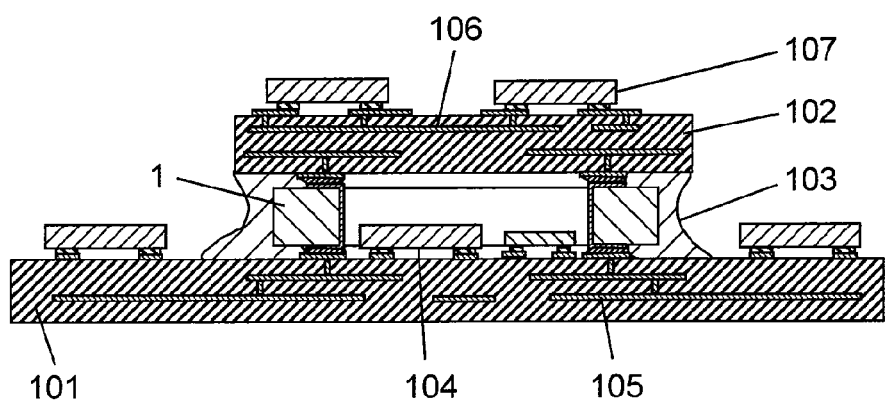
FIG. 3B is a sectional view taken along line 3B-3B in FIG. 3A.

FIGS. 3A and 3B show a structure of electronic circuit mounted structure 100 using interconnect substrate 1 in this exemplary embodiment. FIG. 3A is a schematic perspective view, and FIG. 3B is a sectional view taken along line 3B-3B in FIG. 3A. To make the description simple, FIG. 3A shows the state in which second circuit board 102, disposed on interconnect substrate 1, is removed. In FIG. 3B, second circuit board 102 is also indicated. In electronic circuit mounted structure 100 in this exemplary embodiment, first circuit board 101 and second circuit board 102 are disposed facing each other with interconnect substrate 1 in between.

Circuit component 104, configured with an IC chip, such as a high-frequency circuit, is mounted on first circuit board 101 at a predetermined position and soldered to connecting terminals (not illustrated) of wiring pattern 105 formed in first circuit board 101 such that circuit component 104 is fitted inside opening 13 in interconnect substrate 1.

Circuit component 107, configured typically with a semiconductor element, is disposed on second circuit board 102, and is connected to connecting terminals (not illustrated) of wiring pattern 106 formed in second circuit board 102, typically by soldering.

Connecting terminal electrodes 12 provided on interconnect substrate 1, the connecting terminals of predetermined wiring pattern 105 provided on first circuit board 101, and the connecting terminals of predetermined wiring pattern 106 provided on second circuit board 102 are connected, typically by soldering.

Then, the space between first circuit board 101 and second circuit board 102 at two opposing sides of second circuit board 102 is bonded and fixed by adhesive resin 103 provided on a peripheral portion between protrusions 11 that includes side 108 and a peripheral portion between protrusions 11 that includes side 109.

The thickness of interconnect substrate 1 is, for example, 0.45 mm, and the pitch between connecting terminal electrodes 12 is 0.40 mm. The thickness of second circuit board 102 is, for example, 0.2 mm.

At least two protrusions 11 are provided on the outer side face of interconnect substrate 1, and adhesive resin 13 may be applied to at least one area between protrusions 11.

Next, a method of manufacturing the electronic circuit mounted structure in this exemplary embodiment is described with reference to FIGS. 1A to 3B.

Solder paste is printed on the connecting terminals of wiring pattern 106 of second circuit board 102 shown in FIG. 3B, typically using a metal mask and squeegee. A plurality of chip components (not illustrated) including a capacitor, resistor, and coil, and circuit component 107 are then placed on the connecting terminals of wiring pattern 106. Terminal electrodes of the chip components and circuit component are soldered to the connecting terminals of wiring pattern 106, using a reflow process. In this way, predetermined chip components and circuit component are mounted on second circuit board 102.

Next, solder paste is printed on the connecting terminals of wiring pattern 105 of first circuit board 101, typically using a metal mask and squeegee, and then a chip component and circuit component 104 are placed. In this way, a predetermined chip component and circuit component can be mounted on first circuit board 102. Then, bottom face terminal electrodes 12b of interconnect substrate 1 is positioned and placed on the connecting terminals of wiring pattern 105 on first circuit board 101.

Next, solder paste is supplied, typically by printing, to the connecting terminals of wiring pattern 106 on the main face opposite the face where circuit component 107 is placed on second circuit board 102. These connecting terminals are then positioned and placed on top face connecting terminals 12a of interconnect substrate 1. Next, first circuit board 101 on which interconnect substrate 1 and second circuit board 102 are placed is passed through a reflow process to melt the solder paste and solder.

As a solder material, for example, Sn—Ag—Cu system, Sn—Pb system, Sn—Ag—Bi—In system, and Sn—Zn—Bi system can be used.

Next, as shown in FIG. 3A, adhesive resin 103 is applied to the rims of two opposing sides of second circuit board 102, which are peripheral portions of side 108 and side 109, by a dispenser. Applied adhesive resin 103 flows into the space between first circuit board 101 and second circuit board 102 along the outer side face of interconnect substrate 1 by capillary phenomenon. The thickness of connecting terminal electrodes 12 of interconnect substrate 1 is about 60 μm, and the thickness of soldered portion is about 50 μm. Therefore, the gap between interconnect substrate 1 and the circuit boards, except for that at connecting terminal electrodes 12, is about 110 μm. Adhesive resin 103 enters this gap, but its flow can be suppressed by controlling the viscosity of adhesive resin 103 to 1 to 10 Pa·s, and adhesive resin 103 can be held back by protrusions 11 on interconnect substrate 1.

Then, adhesive resin 103 is thermally cured under predetermined curing conditions to complete electronic circuit mounted structure 100 in this exemplary embodiment.

If protrusions 11 are not provided on interconnect substrate 1, adhesive resin 103 applied using the dispenser will cover the entire outer periphery of interconnect substrate 1. As a result, the space surrounded by first circuit board 101, second circuit board 102, and interconnect substrate 1 becomes sealed. Expansion of air in the space surrounded by first circuit board 101, second circuit board 102, and interconnect substrate 1 will thus cause adhesive resin 103 to splatter due to expanded air, and attach to nearby electronic components in thermally curing adhesive resin 103. This may have detrimental effects, such as a change in the electric characteristics of the electronic components or damage to an electronic component due to curing and contraction of the adhesive resin. Separation of interconnect substrate 1 from first circuit board 101 or second circuit board 102 may also occur. In addition, even if adhesive resin 103 does not splatter, the electronic circuit mounted structure may lower its reliability due to a connection failure caused by thermal expansion of air after it is built in a mobile device and is subject to a heat cycle.

In this exemplary embodiment, adhesive resin 103 may include at least one of epoxy resin, silicone resin, and cyanate ester resin. Epoxy resin may also include at least one of bisphenol A, bisphenol F, biphenyl, and naphthalene.

This exemplary embodiment refers to an example of placing chip components and circuit components on first circuit board 101 in an area inside the opening of interconnect substrate 1. However, chip components or circuit component are generally placed outside the opening. Still more, these components may be placed on the opposite face, or built inside first circuit board 101.

In this exemplary embodiment, chip components or circuit components are not placed on second circuit board 102 in an area inside the opening of interconnect substrate 1. However, these components may be placed in this area. Furthermore, second circuit board 102 with almost the same size as that of interconnect substrate 1 is used in this exemplary embodiment. However, the second circuit board may be larger than that of interconnect substrate 1. Also in this case, adhesive resin can be reliably held back between the protrusions on the interconnect substrate when the adhesive resin is applied. Accordingly, failure caused by increased internal pressure is preventable.

The first exemplary embodiment refers to an example of placing interconnect substrate 1 on first circuit board 101. However, interconnect substrate 1 may be first attached to second circuit board 102; and then interconnect substrate 1, together with second circuit board 102, may be placed on first circuit board 101. Still more, chip components and circuit components may be mounted on the second circuit board or on both faces of the first circuit board and the second circuit board. This achieves higher-density mounting.

This exemplary embodiment also refers to an example of connecting two circuit boards via the interconnect substrate. However, the present invention is not limited to this structure. For example, three or more circuit boards may be connected in multiple stages via the interconnect substrate, respectively. This achieves even higher-density mounting.

Figure 4:
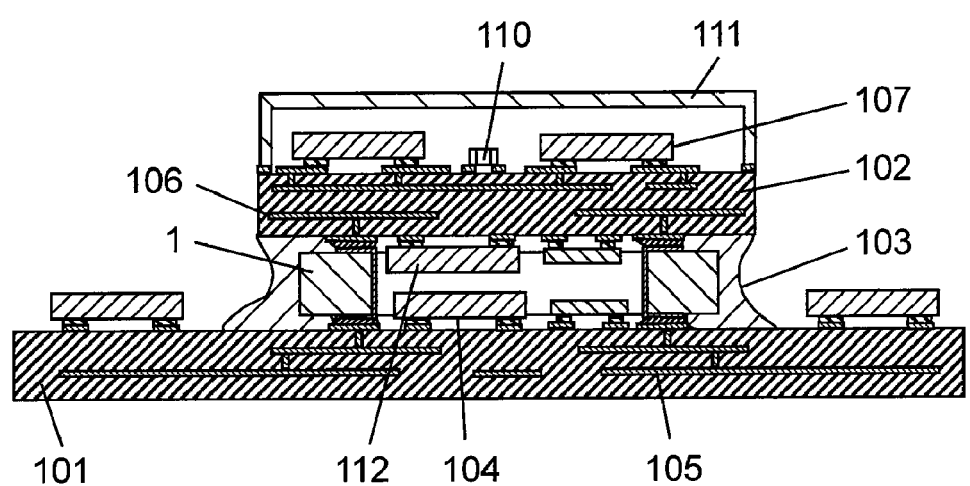
FIG. 4 is a schematic sectional view of another example of the electronic circuit mounted structure in accordance with the first exemplary embodiment of the present invention.

FIG. 4 is a schematic sectional view of another example of the first exemplary embodiment. Circuit component 107 and chip component 110 are mounted on connecting terminals of wiring pattern 106 of second circuit board 102. Circuit component 112 is also placed inside the opening in interconnect substrate 1. Shielding case 111 is connected, typically by soldering, to connecting terminals of wiring pattern 106 of second circuit board 102 such that shielding case 111 covers second circuit board 102.

This achieves higher-density mounting, and offers an electronic circuit mounted structure with good electromagnetic shielding effect.

A method of manufacturing this another example of the exemplary embodiment is described below.

Solder paste is supplied, typically by printing, to the connecting terminals of wiring pattern 106 on the rear face of second circuit board 102. Then, circuit component 112 and interconnect substrate 1 are placed, and the reflow process is applied to melt the solder paste and solder.

Next, solder paste is supplied, typically by printing, to the connecting terminals of wiring pattern 106 on the main face of circuit component 112. Then, circuit component 107 and chip component 110 are placed, and the reflow process is applied to melt the solder paste and solder.

Finally, solder paste is supplied, typically by printing, to the connecting terminals of wiring pattern 105 of first circuit board 101. Then the second circuit board on which circuit component 107 and interconnect substrate 1 are placed is passed through the reflow process to melt the solder paste and solder.

As a solder material, for example, Sn—Ag—Cu system, Sn—Pb system, Sn—Ag—Bi—In system and Sn—Zn—BI system can be used.

Second Exemplary Embodiment

Figure 5A:
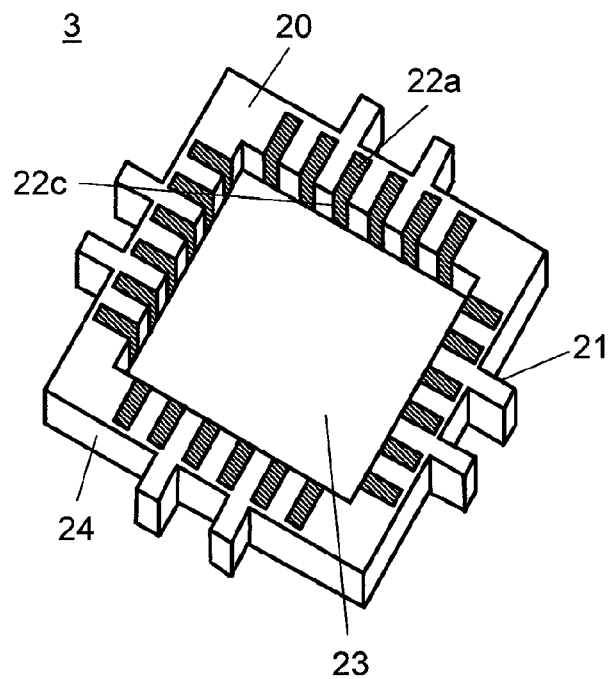
FIG. 5A is a schematic perspective view illustrating a structure of an interconnect substrate in accordance with a second exemplary embodiment of the present invention.
Figure 5B:
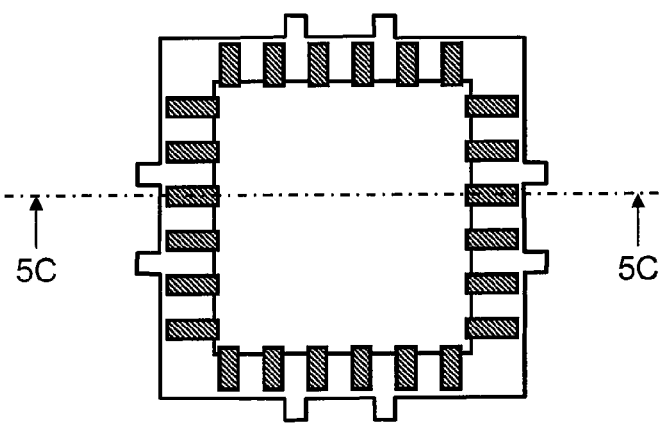
FIG. 5B is a schematic plan view illustrating the structure of the interconnect substrate in accordance with the second exemplary embodiment of the present invention.
Figure 5C:
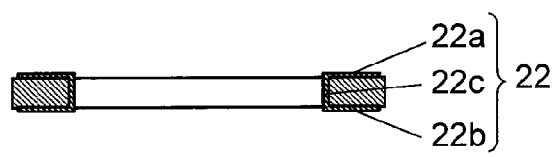
FIG. 5C is a sectional view taken along line 5C-5C in FIG. 5B.

FIGS. 5A to 5C show an interconnect substrate in the second exemplary embodiment of the present invention. FIG. 5A is a schematic perspective view, FIG. 5B is a schematic plan view, and FIG. 5C is a sectional view taken along line 5C-5C in FIG. 5B.

Compared to interconnect substrate 1 in the first exemplary embodiment, interconnect substrate 3 in this exemplary embodiment has at least two protrusions 21 on each of four outer side faces of housing 20.

These protrusions 21 have the thickness same as the thickness of housing 20, as shown in the drawings. Inside housing 20 is opening 23. Connecting terminal electrode 22 can be formed by etching a predetermined pattern after plating copper on the top face, inner side face, and bottom face of housing 20 typically by using both electroless plating and electrolytic plating, same as that in the first exemplary embodiment. This achieves integral connection of top face terminal electrode 22a provided on the top face and bottom face terminal electrode 22b provided on the bottom face of housing 20 via connecting electrode 22c formed on the inner side face of housing 20. A thin metal film (not illustrated) is preferably formed on surfaces of top face terminal electrode 22a, bottom face terminal electrode 22b, and connecting electrode 22c. In this case, for example, the thin gold film is preferably formed by gold plating after nickel plating on a copper-plated film. Solder precoating or anti-corrosive agent may also be applied to the copper-plated film. This improves the wettability of the solder, thus improving the reliability of the soldered portion.

Figure 6:
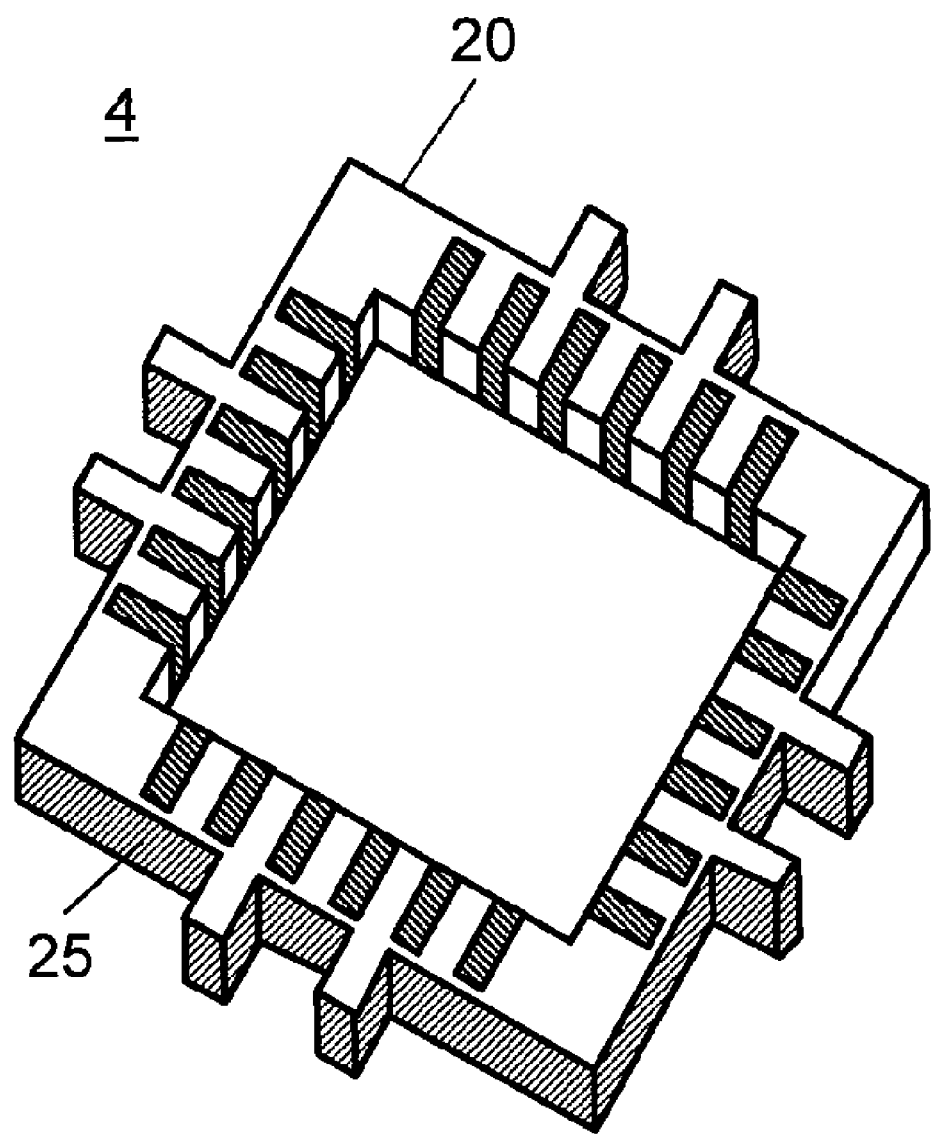
FIG. 6 is a schematic perspective view of another example of the interconnect substrate in accordance with the second exemplary embodiment of the present invention.

FIG. 6 is a schematic perspective view of another example, i.e., interconnect substrate 4, in this exemplary embodiment. As shown in FIG. 6, shielding layer 25 is provided on outer side face (not illustrated) of housing 20 of interconnect substrate 4 of this another example. Shielding layer 25 is formed simultaneously with aforementioned connecting terminal electrode 22 through the same process. In this case, preferably, a part of shielding layer 25 is electrically connected to a ground terminal of connecting terminal electrode 22. Even more preferably, a ground terminal of connecting terminal electrode 22 is electrically connected to a ground plane of a plurality of circuit boards (not illustrated). This enables shielding of external noise to circuit components mounted in the area surrounded by the interconnect substrate on the circuit board, or emission of internal noise generated by circuit components from the interconnect substrate to outside.

Figure 7A:
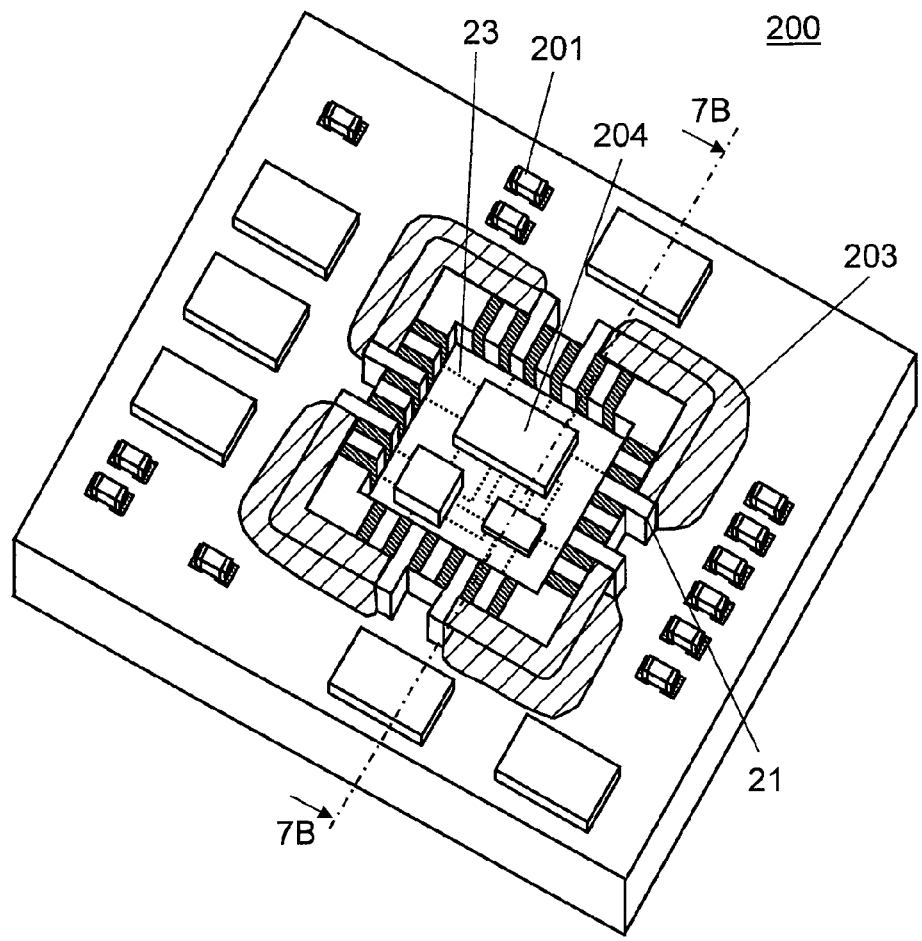
FIG. 7A is a schematic perspective view illustrating a structure of an electronic circuit mounted structure in accordance with the second exemplary embodiment of the present invention.
Figure 7B:
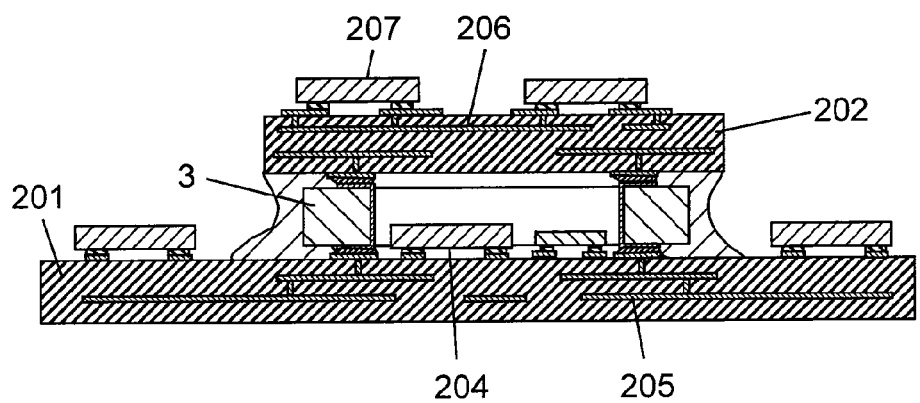
FIG. 7B is a sectional view taken along line 7B-7B in FIG. 7A.

FIGS. 7A and 7B show a structure of electronic circuit mounted structure 200 using interconnect substrate 3 in this exemplary embodiment. FIG. 7A is a schematic perspective view, and FIG. 7B is a sectional view taken along line 7B-7B in FIG. 7A. To make the description simple, FIG. 7A shows the state in which second circuit board 202, disposed on interconnect substrate 3, is removed. In FIG. 7B, second circuit board 202 is also indicated. In electronic circuit mounted structure 200 in this exemplary embodiment, first circuit board 201 and second circuit board 202 are disposed facing each other with interconnect substrate 3 in between.

Compared to electronic circuit mounted structure 100 in the first exemplary embodiment, electronic circuit mounted structure 200 in this exemplary embodiment has adhesive resin 203 provided in the space between first circuit board 201 and second circuit board 202 at the corners of second circuit board 202. Circuit component 204, configured with an IC chip, such as a high-frequency circuit, is connected typically by solder to connecting terminals (not illustrated) of wiring pattern 205 formed in first circuit board 201, and mounted in a predetermined position such that circuit component 204 is fitted inside opening 23 in interconnect substrate 3.

Circuit component 207, configured typically with a semiconductor element, is disposed on second circuit board 202, and is connected to connecting terminals (not illustrated) of wiring pattern 206 formed in second circuit board 202, typically by soldering.

Connecting terminal electrodes 22 provided on interconnect substrate 3, the connecting terminals of predetermined wiring pattern 205 provided on first circuit board 201 and the connecting terminals of predetermined wiring pattern 206 provided on second circuit board 202 are connected, typically by soldering.

Then, the space between first circuit board 201 and second circuit board 202 at a peripheral portion that includes the corner of second circuit board 202 between protrusions 21 are bonded and fixed by adhesive resin 203.

Next, a method of manufacturing an electronic circuit mounted structure in this exemplary embodiment is described with reference to FIGS. 5A to 7B.

Solder paste is printed on the connecting terminals of wiring pattern 206 of second circuit board 202 shown in FIG. 7B, typically using a metal mask and squeegee. A plurality of chip components (not illustrated) including a capacitor, resistor, and coil, and circuit component 207 are then placed on the connecting terminals of wiring pattern 206. Terminal electrodes of the chip components and circuit component 207 are soldered to the connecting terminals of wiring pattern 206, using a reflow process. In this way, predetermined chip components and circuit components are mounted on second circuit board 202.

Next, solder paste is printed on the connecting terminals of wiring pattern 205 of first circuit board 201, typically using a metal mask and squeegee, and a chip component and circuit component 204 are placed. In this way, a predetermined chip component and circuit component can be mounted on first circuit board 201.

Then, bottom face terminal electrode 22b of interconnect substrate 3 is positioned and placed on the connecting terminals of wiring pattern 205 on first circuit board 201.

Next, solder paste is supplied, typically by printing, to the connecting terminals of wiring pattern 206 on the main face opposite the face where circuit component 207 is placed on second circuit board 202. These connecting terminals are then positioned and placed on top face connecting terminals 22a of interconnect substrate 3. Next, first circuit board 201 on which interconnect substrate 3 and second circuit board 202 are placed is passed through a reflow process to melt the solder paste and solder.

As a solder material, for example, Sn—Ag—Cu system, Sn—Pb system, Sn—Ag—Bi—In system, and Sn—Zn—Bi system can be used.

Next, as shown in FIG. 7A, adhesive resin 203 is applied to a peripheral portions of corners of second circuit board 202 by a dispenser. Applied adhesive resin 203 flows into the space between first circuit board 201 and second circuit board 202 along the outer side face of interconnect substrate 3 by capillary phenomenon. The thickness of connecting terminal electrodes 22 of interconnect substrate 3 is about 60 μm, and the thickness of soldered portions is about 50 μm. Therefore, the gap between interconnect substrate 3 and the circuit boards, except for that at connecting terminal electrodes 22, is about 110 μm. Adhesive resin 203 enters this gap, but its flow can be suppressed by controlling the viscosity of adhesive resin 203 to 1 to 10 Pa·s, and adhesive resin 203 can be held back by protrusions 21 on interconnect substrate 3.

Then, adhesive resin 203 is thermally cured under predetermined curing conditions, for example at 150° C. for 3 minutes, to complete electronic circuit mounted structure 200 in this exemplary embodiment.

If protrusions 21 are not provided on interconnect substrate 3, adhesive resin 203 applied using the dispenser will cover the entire outer periphery of interconnect substrate 3. As a result, the space surrounded by first circuit board 201, second circuit board 202, and interconnect substrate 3 becomes sealed. Expansion of air in the space surrounded by first circuit board 201, second circuit board 202, and interconnect substrate 3 will thus cause adhesive resin 203 to splatter due to expanded air, and cause a detrimental effect on nearby electronic components. This may also separate interconnect substrate 3 from first circuit board 201 or second circuit board 202. In addition, even if adhesive resin 203 does not splatter, the electronic circuit mounted structure may lower its reliability due to a connection failure caused by thermal expansion of air after it is sealed in a mobile device and is subject to a heat cycle.

The number of portions where adhesive resin 203 is not applied to the outer periphery of interconnect substrate 3 is greater than that in the first exemplary embodiment, and thus expanded air can be released radially. This increases reliability. In addition, after the electronic circuit mounted structure is built into a mobile device, the adhesive resin on the corners equally divides the stress even if a mechanical stress such as torsion is applied to the electronic circuit mounted structure, resulting in even better reliability.

Furthermore, the distance between protrusions 21 formed on one side of housing 20 is preferably set to be narrow, since a narrower distance increases the application area of adhesive resin 203, allowing the first circuit board and the second circuit board to be even more firmly bonded.

In this exemplary embodiment, adhesive resin 203 may include at least one of epoxy resin, silicone resin, and cyanate ester resin, same as in the first exemplary embodiment. Epoxy resin may also include at least one of bisphenol A, bisphenol F, biphenyl, and naphthalene.

This exemplary embodiment refers to an example of placing chip components and circuit components on first circuit board 201 in an area inside the opening of interconnect substrate 3. However, chip components or circuit component are generally placed outside the opening. Still more, these components may be placed on the opposite face, or built inside first circuit board 201.

Chip components or circuit components are not placed on second circuit board 201 in an area inside the opening of interconnect substrate 3 in this exemplary embodiment. However, these components may be placed in this area. Furthermore, second circuit board 202 with almost the same size as that of interconnect substrate 3 is used in this exemplary embodiment. However, this size may be larger than that of interconnect substrate 3. Also in this case, adhesive resin can be reliably held back between the protrusions on the interconnect substrate when the adhesive resin is applied. Accordingly, failure caused by increased internal pressure is preventable.

The second exemplary embodiment refers to an example of placing interconnect substrate 3 on first circuit board 201. However, interconnect substrate 3 may be first attached to second circuit board 202; and then interconnect substrate 3, together with second circuit board 202, may be placed on first circuit board 201. Still more, chip components and circuit components may be mounted on the second circuit board or on both faces of the first circuit board and the second circuit board. This achieves higher-density mounting.

This exemplary embodiment also refers to an example of connecting two circuit boards via the interconnect substrate. However, the present invention is not limited to this structure. For example, three or more circuit boards may be connected in multiple stages via the interconnect substrate, respectively. This achieves even higher-density mounting.

Third Exemplary Embodiment

Figure 8A:
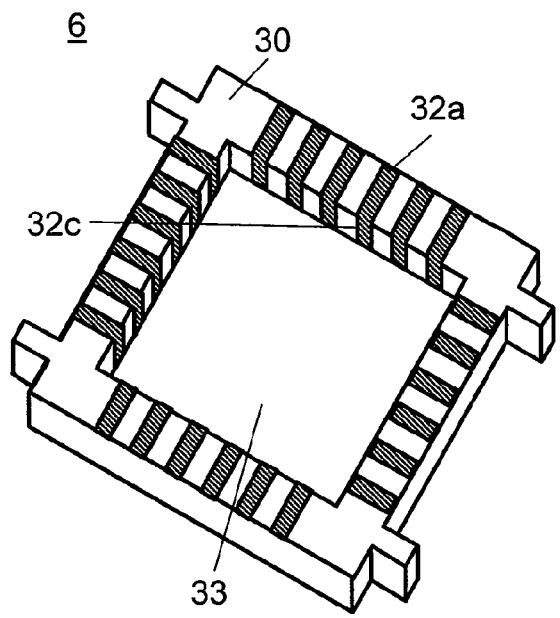
FIG. 8A is a schematic perspective view illustrating a structure of an interconnect substrate in accordance with a third exemplary embodiment of the present invention.
Figure 8B:
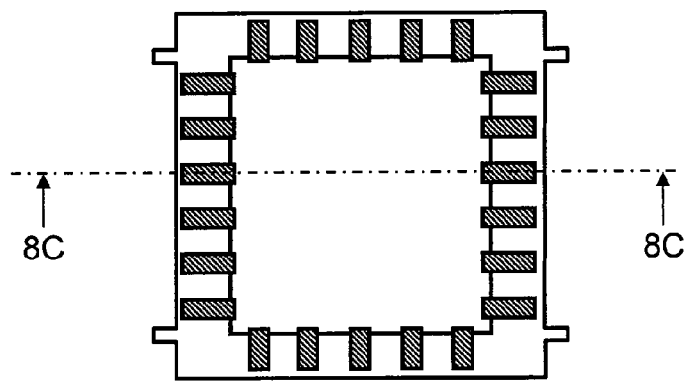
FIG. 8B is a schematic plan view illustrating the structure of the interconnect substrate in accordance with the third exemplary embodiment of the present invention.
Figure 8C:
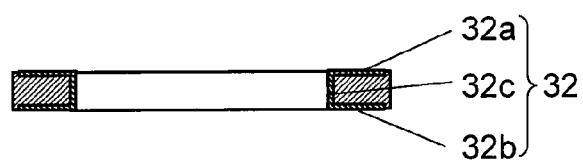
FIG. 8C is a sectional view taken along line 8C-8C in FIG. 8B.

FIGS. 8A to 8C show an interconnect substrate in the third exemplary embodiment of the present invention. FIG. 8A is a schematic perspective view, FIG. 8B is a schematic plan view, and FIG. 8C is a sectional view taken along line 8C-8C in FIG. 8B.

Figure 9A:
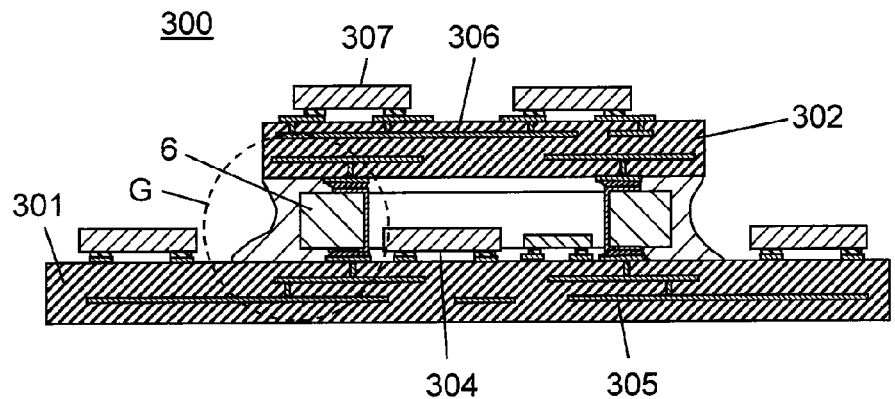
FIG. 9A is a schematic sectional view illustrating a structure of an electronic circuit mounted structure in accordance with the third exemplary embodiment of the present invention.
Figure 9B:
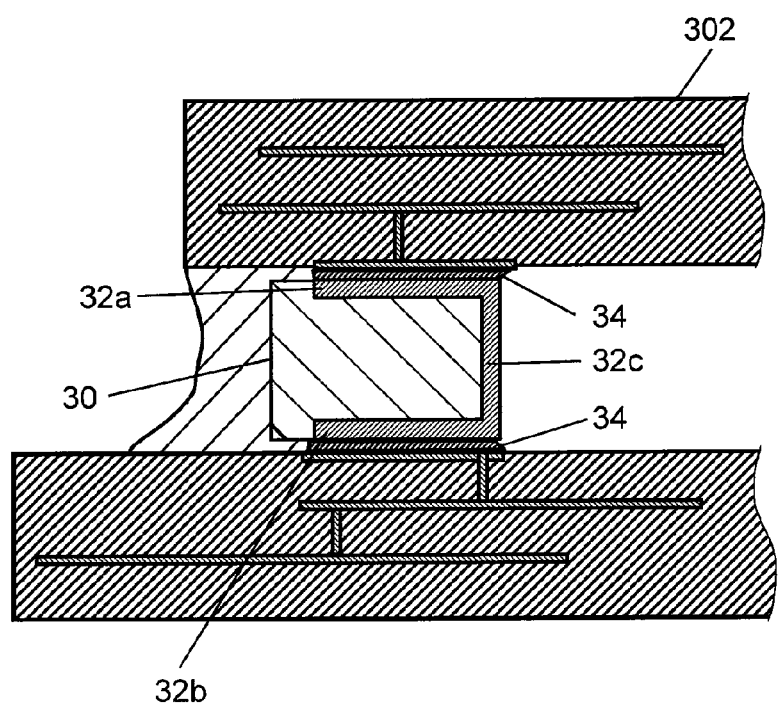
FIG. 9B is a magnified view of portion G in FIG. 9A.

FIGS. 9A and 9B show electronic circuit mounted structure 300 using interconnect substrate 6 in this exemplary embodiment. FIG. 9A is a schematic sectional view, and FIG. 9B is a magnified sectional view of portion G in FIG. 9A.

Compared to interconnect substrate 1 in the first exemplary embodiment, interconnect substrate 6 in this exemplary embodiment has top face terminal electrode 32a and bottom face terminal electrode 32b of connecting terminal electrode 32 in a groove formed in housing 30, and thus they do not protrude from the surface of housing 30.

If housing 30 is made of liquid crystal polymer, about 10-μm groove (not illustrated) is formed in housing 30 at a portion where top face terminal electrode 32a and bottom face terminal electrode 32b will be formed typically by injection molding, etching, or laser processing; and by etching or laser processing if housing 30 is made of ceramic. Connecting terminal electrode 32 is formed by etching a predetermined pattern after plating copper on the top face groove, inner side face and bottom face groove of housing 30 by using typically both electroless plating and electrolytic plating, same as in the first exemplary embodiment. This achieves integral connection of top face terminal electrode 32a provided on the top face and bottom face terminal electrode 32b provided on the bottom face of housing 30 via connecting electrode 32c formed on the inner side face of housing 30. A thin gold film (not illustrated) is preferably formed on top face terminal electrode 32a, bottom face terminal electrode 32b, and connecting electrode 32c. In this case, for example, the thin gold film is preferably formed by gold plating after nickel plating on a copper-plated film. Solder precoating or anti-corrosive agent may also be applied to the copper-plated film. This improves the wettability of the solder, thus improving the reliability of the soldered portion.

In electronic circuit mounted structure 300 in this exemplary embodiment, as shown in FIG. 9A, first circuit board 301 and second circuit board 302 are disposed facing each other with interconnect substrate 6 in between.

Circuit component 304, configured with an IC chip, such as a high-frequency circuit, is mounted on first circuit board 301 at a predetermined position and soldered to connecting terminals (not illustrated) of wiring pattern 305 formed in first circuit board 301 such that circuit component 304 is fitted inside opening 33 in interconnect substrate 6.

Circuit component 307, configured typically with a semiconductor element, is disposed on second circuit board 302, and is connected to connecting terminals (not illustrated) of wiring pattern 306 formed in second circuit board 302, typically by soldering.

Connecting terminal electrodes 32 provided on interconnect substrate 6, the connecting terminals of predetermined wiring pattern 305 provided on first circuit board 301, and the connecting terminals of predetermined wiring pattern 306 provided on second circuit board 302 are connected, typically by soldering.

Then, the space between first circuit board 301 and second circuit board 302 is bonded and fixed, using the same adhesive resin 303 and the same method as in the first exemplary embodiment.

Next, a method of manufacturing an electronic circuit mounted structure in this exemplary embodiment is described with reference to FIGS. 8A to 9B.

Solder paste is printed on the connecting terminals of wiring pattern 306 of second circuit board 302 shown in FIG. 9A, typically using a metal mask and squeegee. A plurality of chip components (not illustrated) including a capacitor, resistor, and coil, and circuit component 307 are then placed on the connecting terminals of wiring pattern 306. Terminal electrodes of the chip components and the circuit components, and the connecting terminals of wiring pattern 306 are soldered using a reflow process. In this way, predetermined chip components and circuit components are mounted on second circuit board 302.

Next, solder paste is printed on the connecting terminals of wiring pattern 305 on first circuit board 301, typically using a metal mask and squeegee, and a chip component and circuit component 304 are placed. In this way, a predetermined chip component and circuit component can be mounted on first circuit board 301. Then, bottom face terminal electrodes 32b of interconnect substrate 6 is positioned and placed on the connecting terminals of wiring pattern 305 on first circuit board 301.

Next, solder paste is supplied, typically by printing, to the connecting terminals of wiring pattern 306 on the main face opposite the face where circuit component 307 is placed on second circuit board 302. These connecting terminals are then positioned and placed on top face connecting terminals 32a of interconnect substrate 6. Next, first circuit board 301 on which interconnect substrate 6 and second circuit board 302 are placed is passed through a reflow process to melt the solder paste and solder.

As a solder material, for example, Sn—Ag—Cu system, Sn—Pb system, Sn—Ag—Bi—In system, and Sn—Zn—Bi system can be used.

Next, adhesive resin is applied to a peripheral portion of second circuit board 302, same as in the first exemplary embodiment, by a dispenser. Applied adhesive resin flows into the space between first circuit board 301 and second circuit board 302 along the outer side face of interconnect substrate 6 by capillary phenomenon.

As shown in FIG. 9B, top face terminal electrode 32a and bottom face terminal electrode 32b of interconnect substrate 6 are formed in the groove of housing 30. Therefore, a gap between interconnect substrate 6 and the first circuit board and second circuit board is about 50 μm, which is the thickness of soldered portion 34.

This gap is about half of that in the first exemplary embodiment, and suppresses the adhesive resin from entering the inside area surrounded by interconnect substrate 6. There is thus no effect on circuit component 304 mounted on the inside area surrounded by interconnect substrate 6.

Then, the adhesive resin is thermally cured under a predetermined curing condition to complete electronic circuit mounted structure 300 in this exemplary embodiment.

Top face terminal electrode 32a and bottom face terminal electrode 32b formed in the groove do not preferably protrude from the surface of housing 30.

This structure can further reduce the gap between interconnect substrate 6 and the circuit boards of the electronic circuit mounted structure. Accordingly, entering of the adhesive resin into the area surrounded by interconnect substrate 6 on applying the adhesive resin is preventable.

A shielding layer may also be formed on the outer side face of housing 30 of interconnect substrate 6 in this exemplary embodiment. Provision of the shielding layer provides interconnect substrate 6 with the electromagnetic shielding function.

This exemplary embodiment refers to an example of connecting two circuit boards via the interconnect substrate. However, the present invention is not limited to this structure. For example, three or more circuit boards may be connected in multiple stages via the interconnect substrate, respectively. This achieves even higher-density mounting.

Fourth Exemplary Embodiment

Figure 10A:
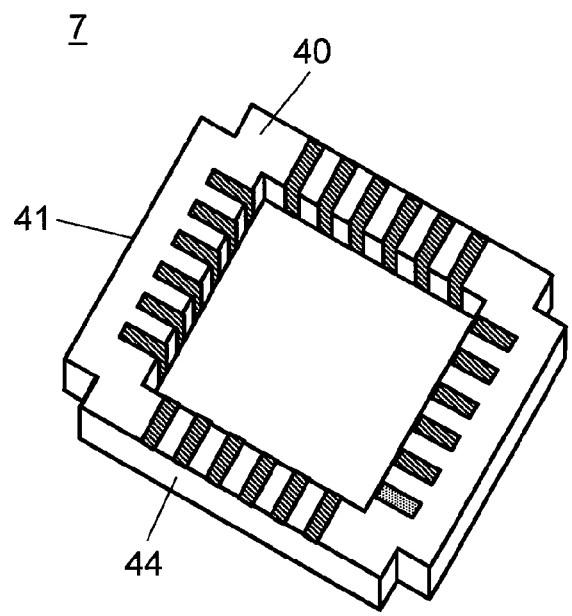
FIG. 10A is a schematic perspective view illustrating a structure of an interconnect substrate in accordance with a fourth exemplary embodiment of the present invention.

FIG. 10A is a schematic perspective view of interconnect substrate 7 in the fourth exemplary embodiment of the present invention.

Compared to interconnect substrate 1 in the first exemplary embodiment, interconnect substrate 7 in this exemplary embodiment has protrusion 41 on each of two opposing sides of interconnect substrate 7. Protrusion 41 has a rectangular shape broader in the sideway, compared to that of protrusion 11.

This shape increases the mechanical strength of interconnect substrate 7, achieving a structure strong to torsion.

In particular, this structure is effective in suppressing thermal deformation of interconnect substrate 7 when a reflow process is applied after placing interconnect substrate 7 on a circuit board (not illustrated).

Figure 10B:
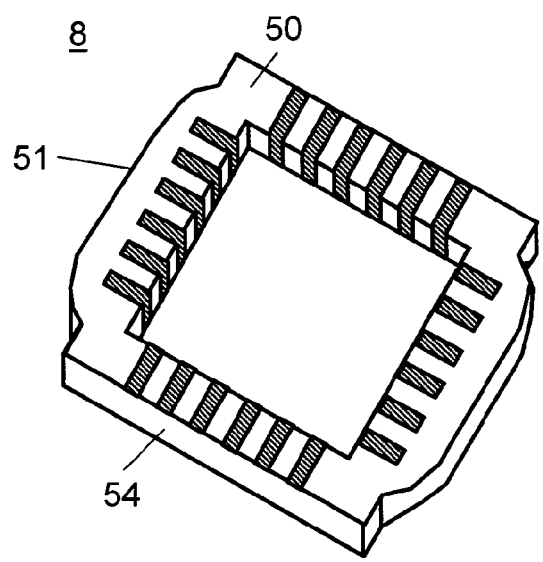
FIG. 10B is a schematic perspective view of another example of the interconnect substrate in accordance with the fourth exemplary embodiment of the present invention.

FIG. 10B is a schematic perspective view of another example, i.e., interconnect substrate 8, in this exemplary embodiment. As shown in FIG. 10B, interconnect substrate 8 has protrusion 51 with curved corners.

This shape reduces a projected area of the protrusion, compared to that of interconnect substrate 7, thus reducing the placement area when interconnect substrate 8 is placed on the circuit board (not illustrated).

Same as another example of the first exemplary embodiment, a shielding layer (not illustrated) may be provided on outer side face 44 of housing 40 of interconnect substrate 7. Or, the shielding layer (not illustrated) may be provided on outer side face 54 of housing 50 of interconnect substrate 8. This enables shielding of external noise to mounted circuit components inside the opening of the interconnect substrate on the circuit board, or emission of internal noise generated by circuit components from the interconnect substrate to outside.

Industrial Applicability

An interconnect substrate of the present invention and an electronic circuit mounted structure using this interconnect substrate avoids covering the entire periphery of the interconnect substrate with adhesive resin during manufacturing. Accordingly, occurrence of failures, including connection failure or splattering of resin during thermal curing of the adhesive resin, can be minimized. A highly reliable electronic circuit mounted structure that allows high-density mounting is thus achievable, with potential application to the field of mobile devices.

The invention claimed is:

1. An electronic circuit mounted structure comprising:
    a first circuit board having a first wiring pattern;
    a second circuit board having a second wiring pattern;
    an interconnect substrate for connecting the first circuit board and the second circuit board; and
    adhesive resin for bonding the first circuit board, the second circuit board, and the interconnect substrate, wherein:
    the interconnect substrate has a frame-like polygonal shape, the interconnect substrate including a housing with a protrusion on its outer side face and a plurality of connecting terminal electrodes for connecting top and bottom faces of the housing,
    the first wiring pattern is connected to one of the plurality of connecting terminal electrodes by solder and the second wiring pattern is connected to one of the plurality of connecting terminal electrodes by solder, and
    the adhesive resin is formed on at least one of the outer side faces between the protrusions.

2. The electronic circuit mounted structure of claim 1, wherein:
    at least two protrusions are provided on the outer side face of each of two opposing sides of the housing, and
    the adhesive resin is formed on the outer side face between the protrusions of the interconnect substrate where none of the protrusions are formed.

3. The electronic circuit mounted structure of claim 1, wherein:
    at least two protrusions are provided on the outer side face of each of four sides of the housing, and
    the adhesive resin is formed between the protrusions provided on adjacent outer side faces of the housing.

4. The electronic circuit mounted structure of one of claims 1 to 3, wherein the housing of the interconnect substrate has a shielding layer on the outer side face.

5. The electronic circuit mounted structure of claim 4, wherein the shielding layer is electrically connected to the connecting terminal electrodes.

* * * * *